US006909978B2

(12) United States Patent
Bostoen et al.

(10) Patent No.: US 6,909,978 B2
(45) Date of Patent: Jun. 21, 2005

(54) SIGNAL PRE-PROCESSING FOR ESTIMATING ATTRIBUTES OF A TRANSMISSION LINE

(75) Inventors: Tom Bostoen, Brugge St Andries (BE); Thierry Pollet, Mechelen (BE); Patrick Jan Maria Boets, Heffen (BE); Leonard Pierre Van Biesen, Aalst (BE)

(73) Assignee: Alcatel, Paris (FR)

( * ) Notice: Subject to any disclaimer, the term of this patent is extended or adjusted under 35 U.S.C. 154(b) by 73 days.

(21) Appl. No.: 10/686,580

(22) Filed: Oct. 17, 2003

(65) Prior Publication Data

US 2004/0080323 A1 Apr. 29, 2004

(30) Foreign Application Priority Data

Oct. 18, 2002 (EP) .......................................... 02292592

(51) Int. Cl.⁷ ............................................... H04B 17/00
(52) U.S. Cl. ......................................... 702/65; 375/224
(58) Field of Search ..................... 379/29.03, 29.05, 379/1.01, 30, 1.03, 254, 1.04, 22.02, 27.01, 27.03, 29.01; 340/815.4; 324/624; 375/224, 341; 702/65

(56) References Cited

U.S. PATENT DOCUMENTS

| | | | | | |
|---|---|---|---|---|---|
| 6,081,125 | A | * | 6/2000 | Krekels et al. | 324/601 |
| 6,205,220 | B1 | * | 3/2001 | Jacobsen et al. | 379/417 |
| 6,263,047 | B1 | * | 7/2001 | Randle et al. | 379/31 |
| 6,421,624 | B1 | * | 7/2002 | Nakayama et al. | 702/117 |
| 2002/0186760 | A1 | * | 12/2002 | Bostoen et al. | 375/224 |
| 2003/0099350 | A1 | * | 5/2003 | Bostoen et al. | 379/417 |
| 2003/0198305 | A1 | * | 10/2003 | Taylor et al. | 375/341 |
| 2004/0022368 | A1 | * | 2/2004 | Bostoen et al. | 379/30 |
| 2004/0196158 | A1 | * | 10/2004 | Sugaya et al. | 340/815.4 |

FOREIGN PATENT DOCUMENTS

| | | |
|---|---|---|
| EP | 1 248 383 A1 | 10/2002 |
| WO | WO 01/01158 A1 | 1/2001 |

OTHER PUBLICATIONS

Boets P et al: "Non–parametric calibration of a time domain reflectometer", Instrumentation and measurement Technology Conference, 1994. IMTC/94. Conference Proceedings. 10ᵗʰ Aniversary. Advanced Technologies in I & M., 1994 IEEE Hamamatsu, Japan May 10–12 1994, New York, NY, USA, IEEE, pp. 114–117 XP010122026.

Bostoen T. et al: "Estimation of the transfer Function of a Subscriber Loop by means of a 1–Port Scattering Parameter Measurement at the Central Office", Journal of Selected Areas in Communications (J–SAC), Jun. 2002, pp. 1–14.

* cited by examiner

*Primary Examiner*—Carol S. W. Tsai
(74) *Attorney, Agent, or Firm*—Sughrue Mion, PLLC

(57) ABSTRACT

In the process of estimating attributes of a transmission line from reflectometry measurements, small yet important reflections may be drowned in the immediate reflected signal owing to the mismatch between the reference impedance with respect to which the 1-port scattering parameter of the line has been determined and the characteristic impedance of the line.

The major part of the near-end reflections are eliminated by estimating the characteristic impedance of the line, and by converting the 1-port scattering parameter of the line from the reference impedance base to the estimated characteristic impedance base.

However, there is still a residual influence of the near-end reflections. It is then highly necessary to determine a time zone wherein the residual near-end reflections are enclosed so as their contribution is further neutralized in the process of estimating attributes of the transmission line.

4 Claims, 7 Drawing Sheets

SIGNAL PRE-PROCESSING FOR ESTIMATING ATTRIBUTES OF A TRANSMISSION LINE

The present invention relates to a method for estimating attributes of a transmission line from reflectometry measurements, as described in the preamble of claim 1, and to an apparatus wherein the method is applied, as described in the preamble of claim 3.

Such a method is already known in the art, e.g. from the article entitled 'Estimation of the Transfer Function of a Subscriber Loop by means of a 1-Port Scattering Parameter Measurement at the Central Office', published in the Journal of Selected Areas in Communications (J-SAC) of June 2002. Therein, a method to predict the transfer function of a local loop from reflectometry measurements is described.

A local loop is a two-conductor transmission line that connects customer premises to a central office of a telecommunication network. Originally, the local loop has given the customer access to the Plain Old Telephony Service (POTS). This copper-wired access network has been de-facto the medium to deliver at the best cost new telecommunication services to residential users and small business offices. Digital Subscriber Line (DSL) services exploits the frequency band above 4 kHz up to several MHz, which is not used by the POTS, to provide the customer with high speed access (up to a few Mbit/s).

Nevertheless, the local loop was engineered for voice-band transmission without any prospect for data telecommunication services operating at higher frequencies. The local loop may have several impairments for DSL services that do not affect the POTS, such as bridged taps (open ended line derivation), mixed wire gauge, splices, etc. DSL services are mostly affected by reflections arising along the line, which stem from any non-uniformity in the impedance of the transmission line. Reflections interfere with the direct DSL signal and, at those frequencies for which the interference is destructive, reduce the magnitude of the received signal or alternatively decrease the Signal Noise Ratio (SNR). It is therefore necessary to evaluate a priori the line quality before implementing DSL services.

In a preliminary step of the known method, a physical model of the local loop is defined from the electromagnetic theory specifying how the voltage and current waves propagate throughout the loop.

The local loop is modeled as comprising a plurality of line segments spliced to each other in a tree-like structure.

A line segment is modeled by the brace $(Z_0, e^{-\gamma l})$ where $Z_0$ is the characteristic impedance of the line segment, $\gamma$ is the propagation constant of the line segment, and $l$ is the length of the line segment. $Z_0$ and $\gamma$ can be expressed as a function of the frequency f and of a finite number of coefficients, the coefficients being defined from the cross-sectional geometric dimensions of the line and the material constants of the line. $(Z_0, e^{-\gamma l})$ specifies the way the voltage and current waves propagate along the line. The boundary conditions, which the line voltage and the line current must comply with at a splice or at a termination, yield the reflection and transmission factor of the voltage and current waves at that splice or at that termination. Extending the reasoning to the entire loop yields a parametric model of the local loop specifying how the voltage and current waves propagate throughout the loop, such as the scattering matrix or the ABCD matrix.

In a further step of the known method, an initial electrical signal is generated and coupled to a port of the local loop, while the electrical waveforms at that coupling point are observed. The observed waveform is comprised of an amount of the initial signal and an amount of each signal, if any, that is reflected back from any non-uniformity in the impedance of the transmission line. This measurement procedure is known in the art as reflectometry, more specifically as time domain reflectometry or frequency domain reflectometry depending on whether the observed waveform is measured in the time domain or in the frequency domain respectively. The measured signal is called a reflectogram, if no explicit reference to the measurement domain is meant, else a time domain reflectogram or a frequency domain reflectogram.

At that stage of the qualification process, the local loop is considered as a one-port device, the port at which the reflectometry measurements are performed being the reference port.

In a further step of the known method, the coefficient values of the parametric model are estimated. The estimation process includes the steps of:

assigning an initial value to some of the coefficients by making use of a quasi-realistic model of the local loop, computing from the parametric model the 1-port scattering parameter $S_{11}$ of the local loop, namely $S_{11}^{estimated}$, the 1-port scattering parameter $S_{11}$ being defined as the ratio in the frequency domain of the backward travelling wave or reflected wave over the forward travelling wave or incident wave, determining from the reflectometry measurements the 1-port scattering parameter $S_{11}$ of the local loop, namely $S_{11}^{measured}$, quantifying a difference between $S_{11}^{estimated}$ and $S_{11}^{measured}$ by introducing a cost function, reducing the difference by adapting the coefficient values of the parametric model.

Both the measured and the estimated 1-port scattering parameters are determined in a given reference impedance base.

The quasi-realistic model provides initial values to the coefficients of the parametric model for the computation of the 1-port scattering parameter $S_{11}^{estimated}$. The initial values of the coefficients should preferably have the order of magnitude predicted by their formula so that the optimization of the cost function determines a global minimum and does not get trapped in a local minimum. The quasi-realistic model is a white box model with as much a-priori knowledge as possible, as opposed to a black box model. The quasi-realistic model of the local loop is based upon an assumed loop topology, and upon the type of transmission line used in the field as presumably known to the telecommunication operator.

Once the coefficients have been estimated, it is possible to compute the transfer function between any port of the local loop, the local loop now being considered as a multi-port device.

The known method yields good results up to a certain line length, e.g. 2000 meters for 0.4 mm polyethylene cable. For longer loops, the first direct reflections originating from the coupling point between the measurement device and the line dominates the measurements and make the convergence of the parametric model impossible.

It is an object of the present invention to eliminate the near-end reflections and to make the qualification of longer loops possible.

According to the invention, this object is achieved by the method defined in claim 1 and by the apparatus defined in claim 3.

The major part of the near-end reflections are eliminated by carrying out the steps of:

estimating the characteristic impedance of the local loop, more specifically estimating the characteristic impedance of the line segment whereto the measurement device is coupled, converting the 1-port scattering parameter of the local loop from the reference impedance base to the estimated characteristic impedance base.

However, there is still a residual influence of the near-end reflections. This residual influence is mostly due to the fact that the estimated characteristic impedance does not correspond perfectly to the real characteristic impedance of the line. For example, the estimation of the characteristic impedance does not take into account inhomogeneities of the line and the resulting backscatter.

It is then highly necessary to determine a time zone wherein the residual near-end reflections are enclosed so as their contribution is further neutralized in the process of qualifying the local loop.

The processing of the 1-port scattering parameter in accordance with the present invention can be performed indistinctly in the time domain or in the frequency domain, or in any theoretical referent as known to the skilled person.

The present invention is applicable to any type of transmission line, irrespective of the nature of the transmission medium and irrespective of the telecommunication technology being used thereon.

The present invention is not restricted to the mentioned prior art but is applicable to any method or apparatus making use of reflectometry measurements to estimate attributes of a transmission line, no matter what those attributes are and no matter the domain in which the estimation is performed.

Further characterizing embodiments of the present invention are mentioned in the appended claims.

It is to be noticed that the term 'comprising', also used in the claims, should not be interpreted as being restricted to the means listed thereafter. Thus, the scope of the expression 'a device comprising means A and B' should not be limited to devices consisting only of components A and B. It means that with respect to the present invention, the relevant components of the device are A and B.

Similarly, it is to be noticed that the term 'coupled', also used in the claims, should not be interpreted as being restricted to direct connections only. Thus, the scope of the expression 'a device A coupled to a device B' should not be limited to devices or systems wherein an output of device A is directly connected to an input of device B. It means that there exists a path between an output of A and an input of B which may be a path including other devices or means.

The above and other objects and features of the invention will become more apparent and the invention itself will be best understood by referring to the following description of an embodiment taken in conjunction with the accompanying drawings wherein.

Figure 1:
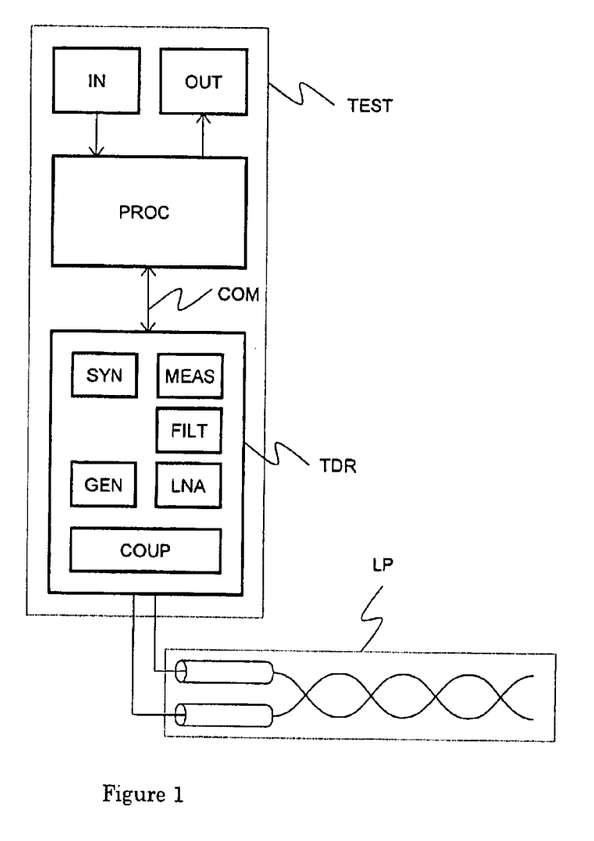
FIG. 1 represents a measurement device according to the invention.

The test device TEST as depicted in FIG. 1 comprises:

input means IN, output means OUT, a time domain reflectometry unit TDR, a processing unit PROC.

The input means IN and the output means OUT are coupled to the processing unit PROC. The processing unit PROC is coupled to the time domain reflectometry unit TDR via a data communication bus COM, such as a serial bus. The time domain reflectometry unit TDR is coupled to the local loop LP.

The test device TEST is adapted to estimate the transfer function of a local loop from reflectometry measurements. The test device TEST is integrated as a handheld testing device that can be used by a technician in the field, e.g. at the central office next to a distribution frame.

The input means IN comprise a keyboard and a computer mouse associated with a graphical user interface and are adapted to:

trigger the time domain reflectometry measurements, enter or select from a drop-down menu any useful pieces of information such as characteristics of the local loop (used in the parametric model), measurement settings, etc.

The output means OUT comprise a display screen, e.g. to provide a technician with the outcome of the measurement procedure.

The time domain reflectometry unit TDR comprises the following functional units:

a generation unit GEN, to generate an electrical signal of a given shape and within a given spectrum range, a measurement unit MEAS, to measure in the time domain an electrical signal, such as a voltage, including an analog to digital converter, a coupling unit COUP, to couple the excitation signal from the generation unit GEN to a conductor pair and to provide the measurement unit MEAS with the appropriate measurement access points, a low-pass anti-alias filter FILT for the analog to digital conversion, a low-noise amplifier LNA, to amplify the signal from the local loop LP, a synchronization unit SYN, to trigger synchronously the generation unit GEN and the measurement unit MEAS.

The processing unit PROC comprises a Pentium IV processor supplied by Intel Corp, as well as all the necessary hardware as known to the skilled person, such as random access memory, a hard disk, an interruption controller, a DMA controller, a graphic card, I/O peripherals, etc.

The processing unit PROC runs software which carries out any of the method in accordance with the present invention, more specifically:

gather and average the measurement results from the time domain reflectometry unit TDR, process the measurement results in accordance with the present invention, estimate therefrom the transfer function of the local loop, as already known to the art.

The electrical signal used to excite the local loop is a multisine wave ranging from 5 kHz up to 1 MHz with a tone spacing of 5 kHz. The signal type as well as the burst duration can be set via the input means IN.

The measured electrical signals are the line voltage in conjunction with the reflected voltage wave. The latter allows the discrimination of the incident and reflected waves within the line voltage.

Upon request from the operator via the input means IN, the processing unit PROC triggers the time domain reflectometry unit TDR via the data communication bus COM for it to carry out a time domain reflectometry measurement. Thereupon, the synchronization unit SYN triggers both the generation unit GEN, to generate an excitation signal, and the measurement unit MEAS, to start measuring the resulting signals at the coupling point. A measurement is a set of digital samples, each sample being the encoded magnitude of the measured signal at a particular instance of time. The sampling frequency is set to 10 MHz, that is to say the cut off frequency of the anti-alias filter is about 5 MHz. The capturing window is 200 $\mu s$ long so as the frequency resolution matches the tone spacing of the excitation signal. The measurement results are delivered via the data communication bus COM back to the processing unit PROC for further processing. The measurement procedure is repeated a few times over a small period so as to compute the mean and variance value of each sample.

In the following, the operation of the preferred embodiment will be described with reference to an instance LP of a local loop. However, the present invention is not limited thereto.

The topology of the local loop LP, as known to the telecommunication operator and as entered via the input means IN, is a single transmission line.

Figure 2:
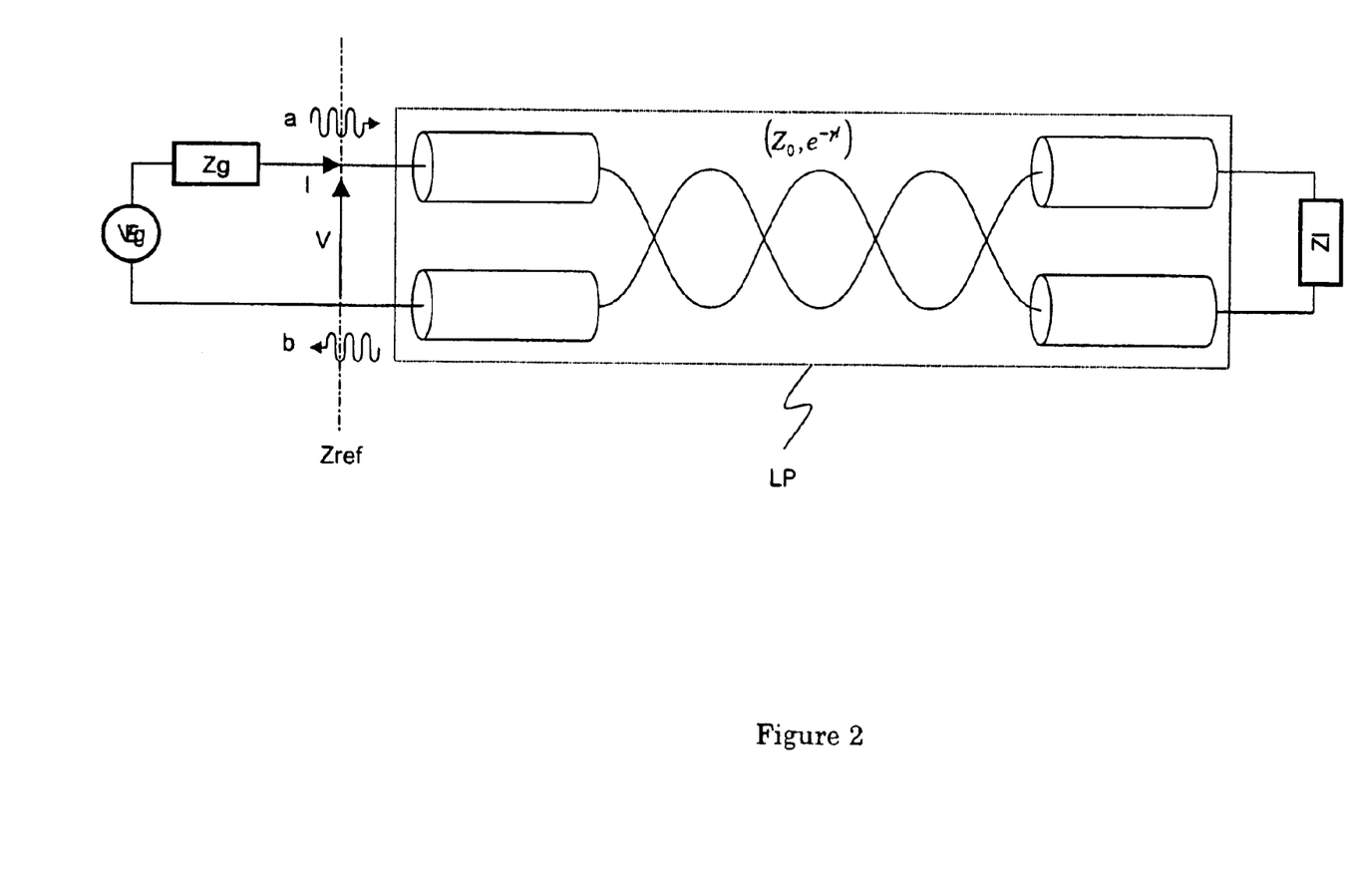
FIG. 2 represents an instance of a local loop chosen as a case survey.

FIG. 2 depicts the electrical circuit of a single transmission line from which the parametric model is established. At one end of the line stands a voltage source Vg serially connected to a generator impedance Zg. At the other end stands a load with an impedance Zl. The line is characterized by its transfer function $e^{-\gamma l}$ and characteristic impedance $Z_0$.

The line is considered as a 1-port device, with V and I being the input voltage and input current at that port.

The forward and backward travelling waves a and b at that port are defined with respect to a reference impedance Zref:

$$a = \frac{V + Z_{ref}I}{2} \quad (1)$$

$$b = \frac{V - Z_{ref}I}{2} \quad (2)$$

The transmission line type, as known to the telecommunication operator and as entered via the input means IN, is an Unshielded Twisted Pair (UTP) consisting of 2 parallel circular cylindrical conductors immersed in a homogeneous dielectric, which is assumed to be linear and isotropic.

$(Z_0, e^{-\gamma l})$ of a UTP is given by:

$$\gamma l = \sqrt{z_s y_p l^2} = \sqrt{a_4 s^2 + a_1 s \sqrt{-s}\frac{J_0}{J_1} + \frac{a_1 a_3}{2}s^2 \Psi} \quad (3)$$

$$Z_0 = \frac{\gamma l}{y_p l} \quad (4)$$

where:

$s = j\omega = j2\pi f$ represents the Laplace frequency, $$\Psi = \frac{3a_2^3 J_3 J_2 + 2a_2 J_1 J_2 + a_2^2 J_0 J_3}{a_2^3 J_2 J_3 + a_2 J_1 J_2 + 3a_2^2 J_0 J_3 + J_0 J_1}$$

denotes an auxiliary function used in the calculations, $J_i = J_i(a_3\sqrt{-s})$ denotes the Bessel function, $y_p = a_5 s/l$ is the parallel per-unit length admittance of the transmission line.

The coefficients $a_1$ to $a_5$ may be given initial values in accordance with:

$$a_1 = \frac{1}{a\pi}\sqrt{\frac{\mu}{\sigma}}\frac{\varepsilon}{\operatorname{arcosh}(D/2a)}l$$

$$a_2 = \left(\frac{a}{D}\right)^2$$

$$a_3 = a\sqrt{\mu\sigma}$$

$$a_4 = \frac{a_1 a_3}{\ln(1/\sqrt{a_2})}$$

$$a_5 = \frac{\pi\varepsilon}{\operatorname{arcosh}(D/2a)}l$$

where:

α is the radius of the circular conductors (same radius for both conductors),

D is the distance between the 2 conductor axis,

σ is the conductivity of the conductor material (e.g., copper),

ε and μ are respectively the electrical permittivity and magnetical permeability of the dielectric material (e.g., polyethylene).

Prior to the reflectometry measurements of the local loop LP, the calibration procedure takes place.

Figure 3:
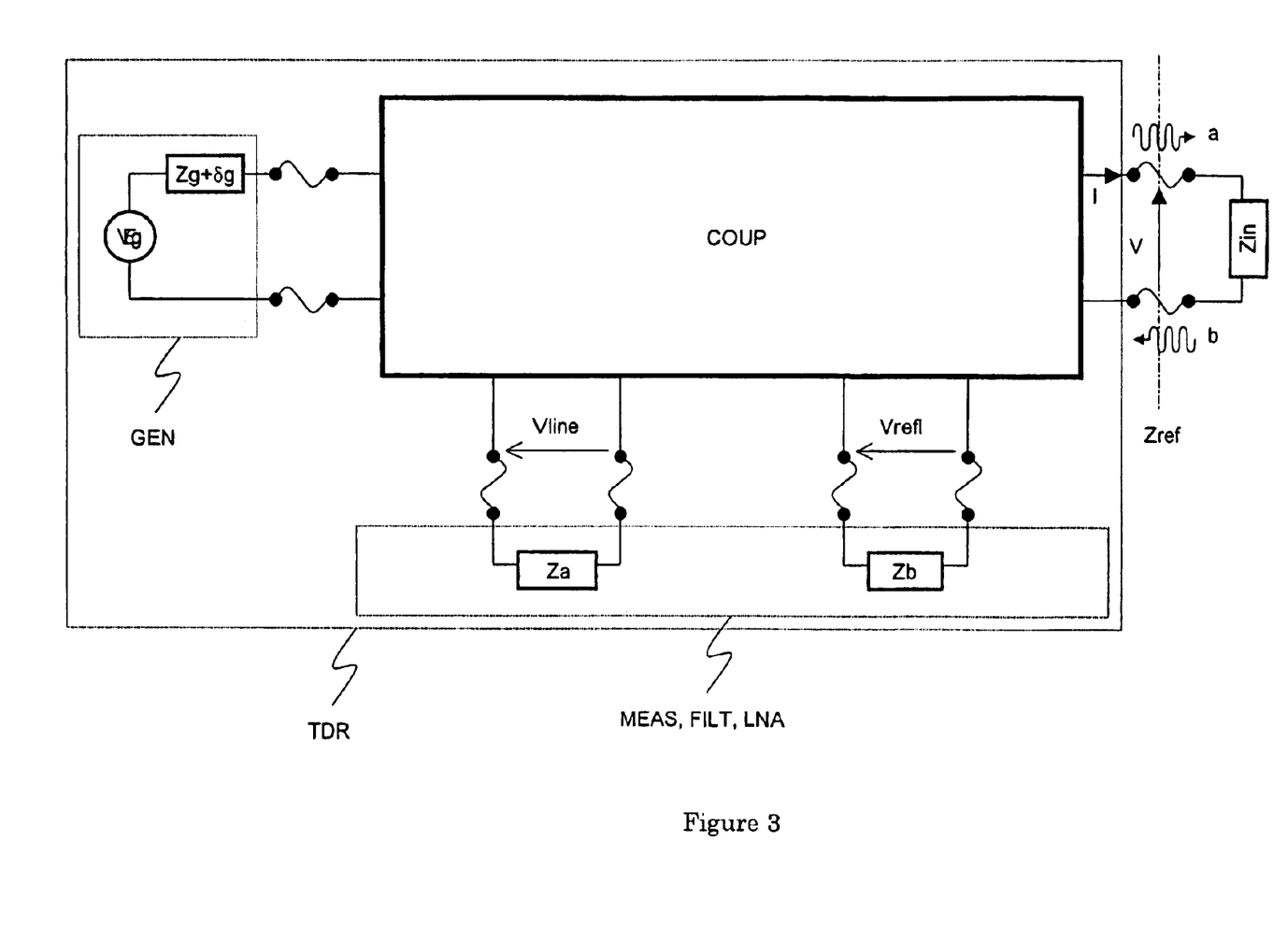
FIG. 3 represents a front end analog unit of the measurement device.

A more accurate model of the time domain reflectometry unit TDR is proposed in FIG. 3. In this model, the following elements are taken into consideration:

the difference δg of the actual generator impedance with respect to the assumed generator impedance Zg, the coupling unit COUP, modeled as a 4-port coupling device and characterized by its own scattering matrix, the input impedance Za and Zb of the devices measuring the line voltage Vline and the reflected voltage wave Vrefl.

Zin is the input impedance of the device under test.

The forward and backward travelling waves a and b can be determined from the measured voltage Vline and Vrefl using the formula:

$$\begin{bmatrix} b \\ a \end{bmatrix} = \begin{bmatrix} \lambda_1 & \lambda_2 \\ \lambda_3 & \lambda_4 \end{bmatrix} \times \begin{bmatrix} V_{line} \\ V_{refl} \end{bmatrix} \quad (5)$$

where $\lambda_1$, $\lambda_2$, $\lambda_3$ and $\lambda_4$ coefficients are defined from the scattering matrix of the coupling unit COUP.

The 1-port scattering parameter in the reference impedance base can be derived from the formula (5):

$$S_{11}^{measured}\Big|_{Z_{ref}} = \frac{b}{a} = \frac{\lambda_1 V_{line} + \lambda_2 V_{refl}}{\lambda_3 V_{line} + \lambda_4 V_{refl}} = \frac{\lambda_1 + \lambda_2 \frac{V_{refl}}{V_{line}}}{\lambda_3 + \lambda_4 \frac{V_{refl}}{V_{line}}} = \frac{1 + C_1 \frac{V_{refl}}{V_{line}}}{C_2 + C_3 \frac{V_{refl}}{V_{line}}} \quad (6)$$

The calibration procedure consist in determining the values of the coefficients $C_1$, $C_2$ and $C_3$. This is achieved by measuring the line voltage Vline and the reflected voltage wave Vrefl with 3 distinct values of the input impedance Zin for which the resulting 1-port scattering parameter is preliminary known:

first measurement with an open circuit, Zin=∞, $S_{11}|_{z_{ref}}=1$,
second measurement with a short circuit, Zin=0, $S_{11}|_{z_{ref}}=-1$,
third measurement with the reference impedance, Zin=Zref, $S_{11}|_{z_{ref}}=0$.

The processing unit PROC gathers the 3 measurement results from the time domain reflectometry unit TDR and obtains therefrom 3 linear equations from which the values of $C_1$, $C_2$ and $C_3$ can be derived.

The processing unit PROC determines the 1-port scattering parameter of the local loop LP in the reference impedance base by using the formula (6), the value of the coefficients $C_1$, $C_2$ and $C_3$ as determined during the calibration procedure and the measurement results of the line voltage Vline and reflected voltage wave Vrefl, the local loop LP being the device under test.

The far-end reflections should be made visible as clear as possible. They may not be distorted by the mismatch between the reference impedance Zref and the characteristic impedance $Z_0$, otherwise very small but still very important reflections, which have traveled a few thousand meters along the line, will be drowned in the immediate reflected signal. A transformation of the base impedance of $S_{11}$ is then highly necessary.

The ideal base impedance is the characteristic impedance $Z_0$ of the line segment whereto the test device TEST is coupled. Estimating this characteristic impedance with respect to the measured input impedance yields good results. Indeed, the longer the line is, the closer the input impedance is to the characteristic impedance.

The input impedance can be derived from the measured 1-port scattering parameter as follows:

$$Z_{in}^{measured} = Z_{ref} \frac{1 + S_{11}^{measured}}{1 - S_{11}^{measured}} \quad (7)$$

The estimation of the characteristic impedance of the local loop LP is based upon the parametric model as expressed in the formula (4).

The preferred estimator is the Maximum Likelihood Estimator (MLE) but the present invention is not limited thereto. MLE is chosen because it is consistent, asymptotically not biased, asymptotically normally distributed, and asymptotically efficient with realistic noise condition.

The MLE cost function is given by:

$$V(\theta) = \sum_{k=1}^{N} \frac{|Z_0^{estimated}(fk, \theta) - Z_{in}^{measured}(fk)|}{\sigma_{Zin}^2(fk)} \quad (8)$$

where:
N is the number of frequency samples,
fk is the $k^{th}$ frequency,

θ is the parameter vector of the parametric model of the characteristic impedance: $\theta=(a_1,a_2,a_3,a_4)$,
$Z_0^{estimated}$ (fk,θ) is the $k^{th}$ frequency sample of the parametric model of the characteristic impedance,
$Z_{in}^{measured}$ (fk) is the $k^{th}$ frequency sample of the measured input impedance,
$\sigma_{Zin}$ (fk) is the estimate of the variance of the $k^{th}$ frequency sample of the measured input impedance.

The minimum of the cost function as a function of the parameter vector θ is found by means of an iterative algorithm. The preferred minimizer is the Levenberg-Marquardt (LM) method but the present invention is not limited thereto.

The minimizer determines a vector $\hat{\theta}$ for which the minimum of the cost function V is reached. The estimated characteristic impedance is then given by $\hat{Z}_0 = Z_0^{estimated}(\hat{\theta})$.

Figure 4:
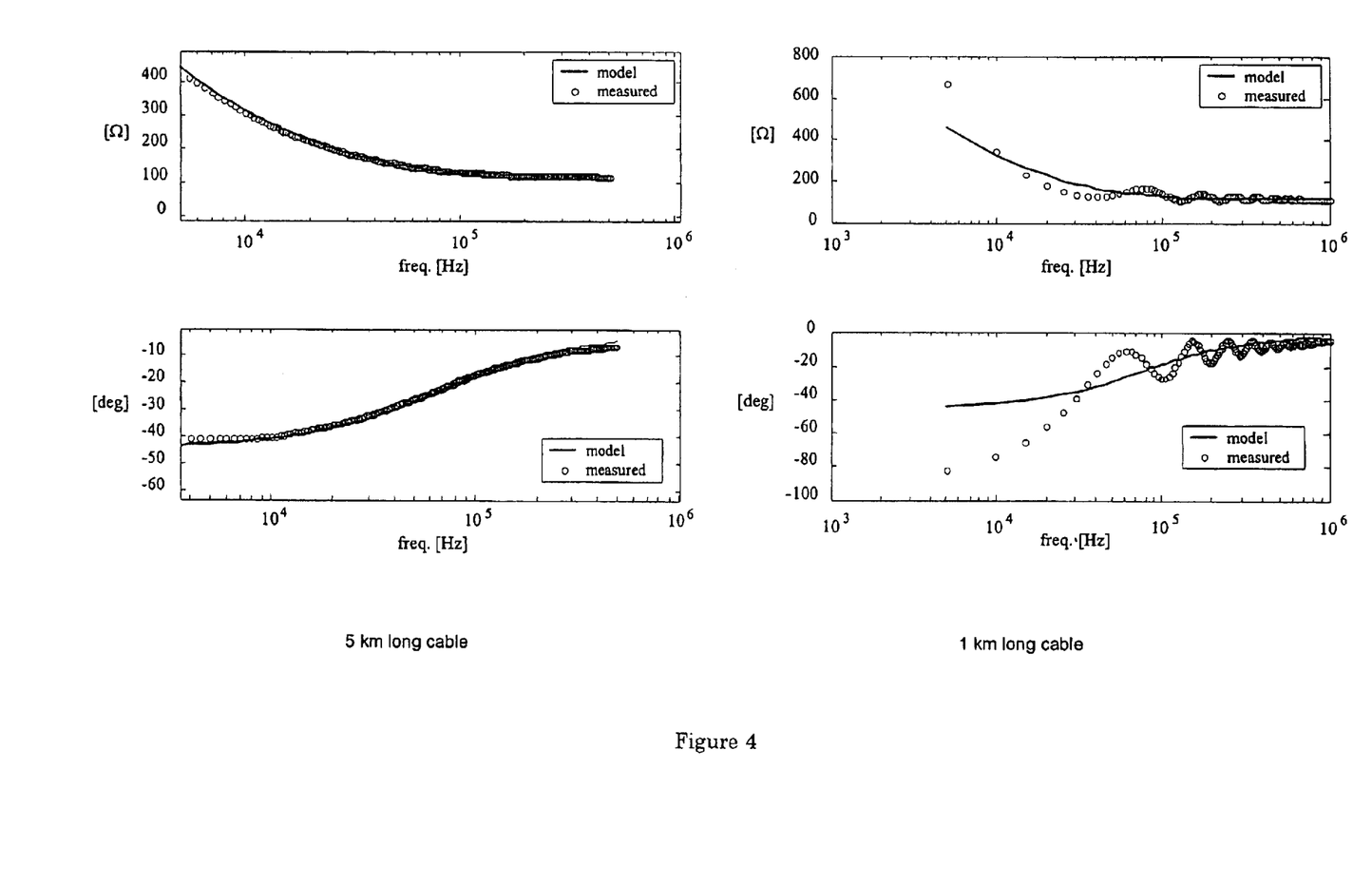
FIG. 4 represents a measured input impedance and an estimated characteristic impedance for a 5 km and a 1 km long 0.4 mm polyethylene cable.

As can be seen in FIG. 4, the estimated characteristic impedance does not take into consideration the higher order variations (peaks and valleys around the asymptote), which represents the contribution of the load impedance and other line segments, if any. Those contributions are irrelevant as far as the characteristic impedance is concerned and are to be over looked by the estimation process.

The measured 1-port scattering parameter is then converted from the reference impedance base to the estimated characteristic impedance base as follows:

$$S_{11}^{measured}\Big|_{\hat{Z}_0} = \frac{Z_{in}^{measured} - \hat{Z}_0}{Z_{in}^{measured} + \hat{Z}_0} \quad (9)$$

Figure 5:
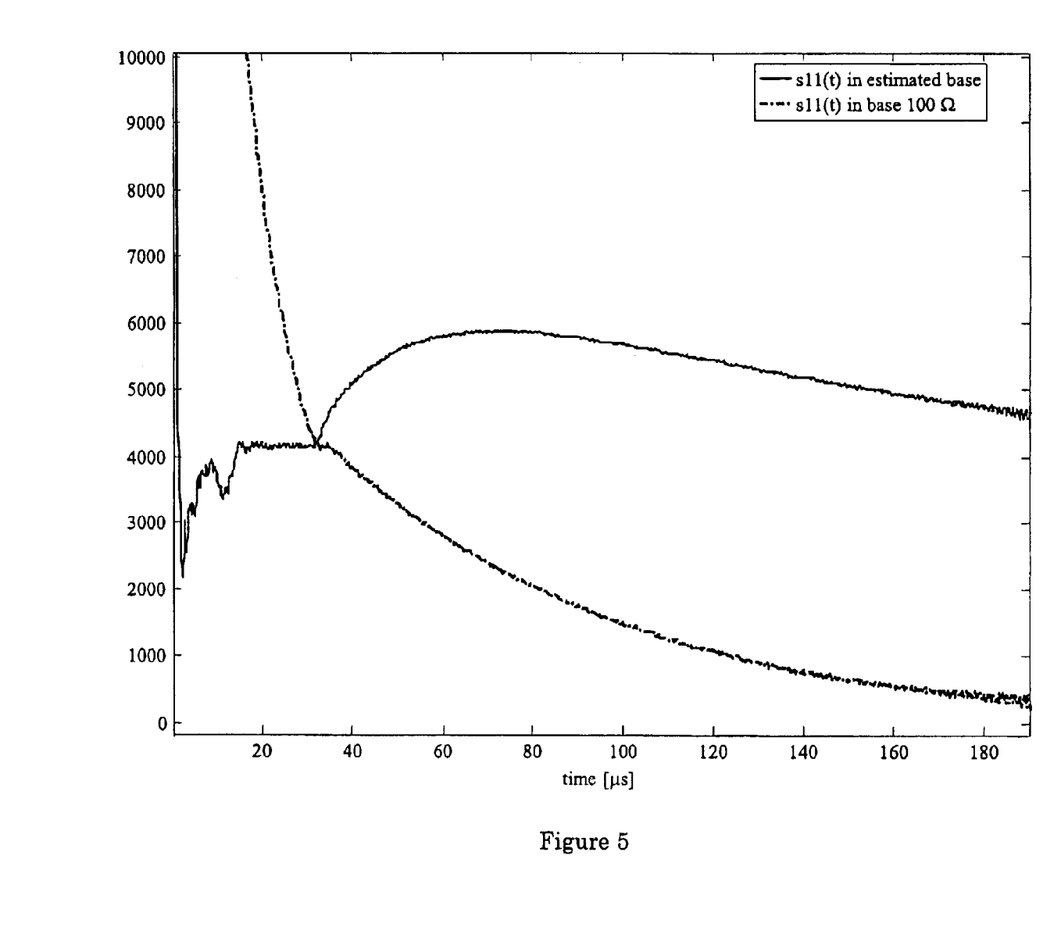
FIG. 5 represents an impulse response of a 3 km long 0.4 mm polyethylene cable in 100 Ω base and in an estimated characteristic impedance base.

As can be seen in FIG. 5, the far-end reflections are noticeable after the conversion, yet there are still some non negligible near-end reflections.

The determination of the time zone wherein the residual near-end reflections are enclosed—named hereafter the neutral zone—, shall be carried out in the time domain using an inverse Discrete Fourier Transform (DFT) of $S_{11}^{measured}|_{\hat{Z}_0}$. The resulting signal $s_{11}(t)|_{\hat{Z}_0}$ is named the impulse response of the local loop.

However, inverse DFT cannot be applied directly on $S_{11}^{measured}|_{\hat{Z}_0}$ (f) because not all frequency samples contain meaningful data There are regulations by the telecommunication operators that excitation signals below and in the voice band are not allowed on subscriber lines. Also, excitation of such lines above 1 MHz is not advised due to the extreme line attenuation. Last, the measured signal gets no DC component owing to the AC coupling. Subsequently, a number of spectral lines will not contain any imposed power.

Non-energetic frequency samples of $S_{11}^{measured}|_{\hat{Z}_0}$ (f) are reset to zero, while the DC component $S_{11}^{measured}|_{\hat{Z}_0}$ (0) is set to 1, as predicted from the theoretical model. The inverse DFT of such a spectrum will give rise to ringing effects in the time domain. The ringing will be smoothed away with a liner phase scale-spaced filter or any other appropriate filter as known to the skilled person.

The inverse DFT of the filtered $S_{11}^{measured}|_{\hat{Z}_0}$ (f) contains time alias because the capturing window T is not long enough to reduce the time alias below the quantisation level. The time alias will be reduce to an acceptable level by fitting an exponential decaying function $A'e^{-B't}$ on the tail of $s_{11}(t)|_{\hat{Z}_0}$ (see FIG. 6).

Figure 6:
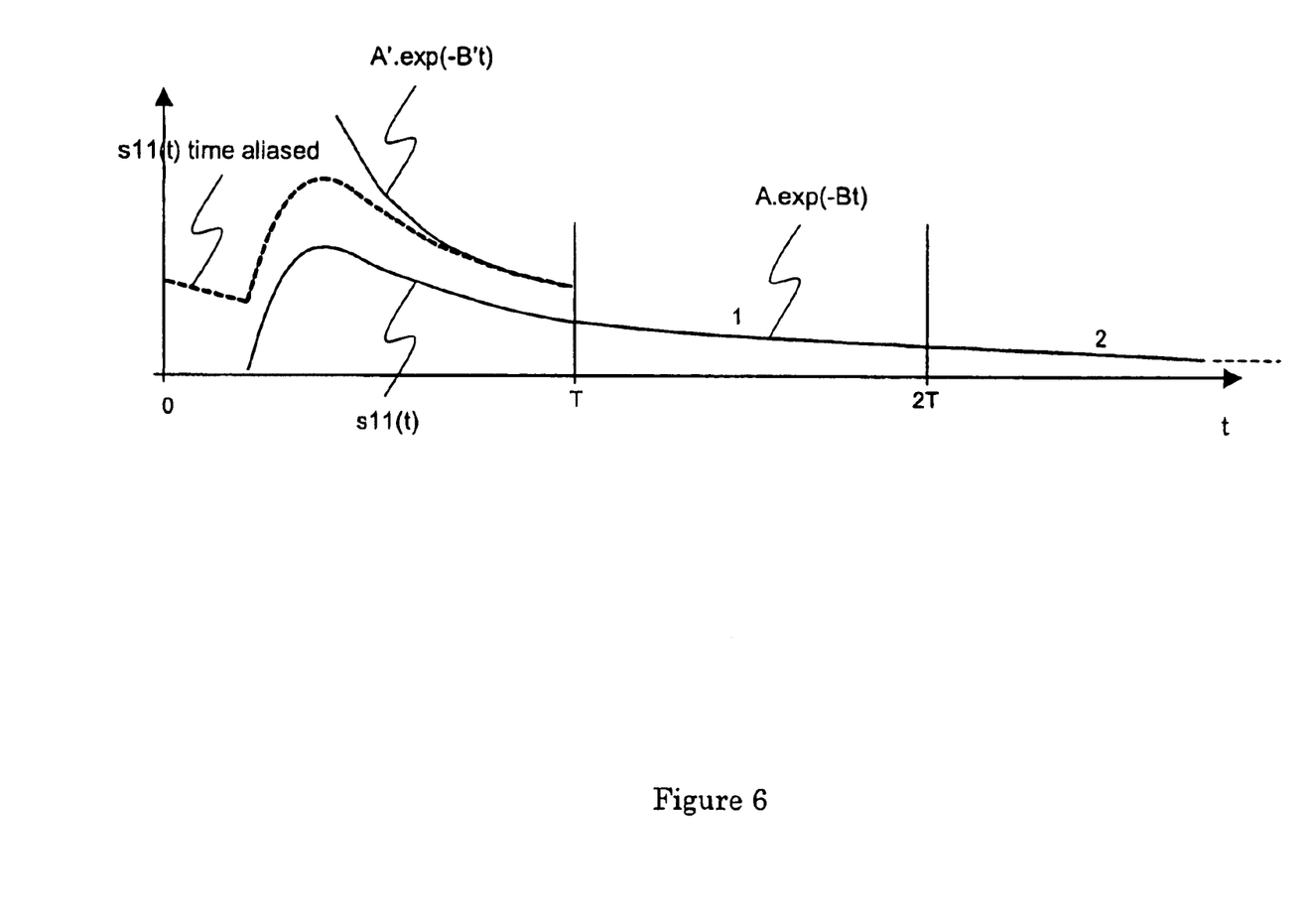
FIG. 6 represents the removal of the time alias from an impulse response by fitting an exponential decaying function on the tail of the impulse response.

A least square estimator is used to find the parameters A' and B'. The parameters are estimated on the last portion of the tail.

The time alias g(t) is given by an infinite sum of exponential decaying functions:

$$g(t) = Ae^{-Bt} + Ae^{-B(t+T)} + Ae^{-B(t+2T)} + \ldots = Ae^{-Bt}\sum_{k=0}^{\infty} e^{-kBT}$$

$$\text{As } \sum_{k=0}^{\infty} e^{-kBT} = \frac{1}{1-e^{-BT}}, \; g(t) = Ae^{-Bt}\frac{1}{1-e^{-BT}}$$

The relation with the estimated parameters is given by:

B=B'

A=A'e^{B'T}

The de-aliased impulse response is obtained with:

$$s_{11}(t)|_{Z_0, de\text{-}aliased} = s_{11}(t)|_{Z_0} - g(t) \quad (10)$$

The skilled person is entitled to consider any other alternative but the exponential decaying series and the least square estimator as a valid alternative.

Figure 7:
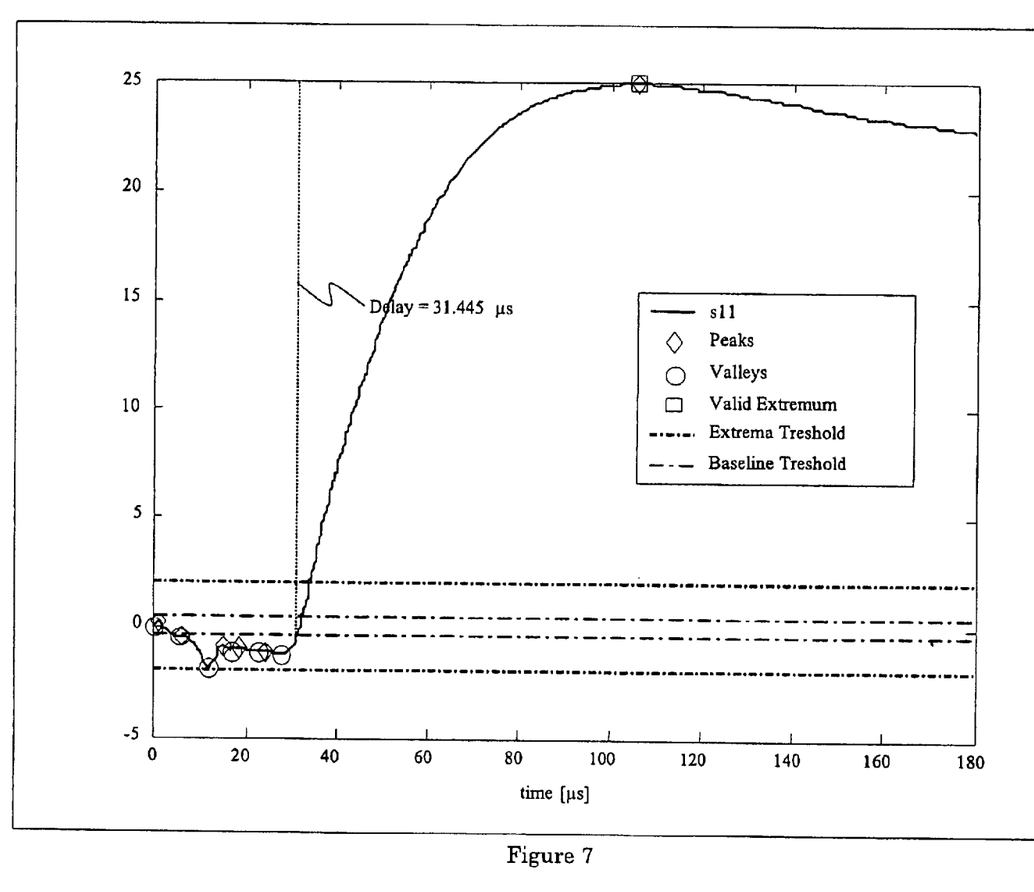
FIG. 7 represents an equal level impulse response and the determination of the neutral zone by means of an extrema and a baseline threshold.

The determination of the neutral zone is achieved by estimating the start of the far-end reflections.

First of all, the de-aliased impulse response is amplitude-equalized to compensate for signal attenuation.

The equal level impulse response $s_{11}(t)|_{Z_0,equal\;level}$ is obtained by multiplying the de-aliased impulse response $s_{11}(t)|_{Z_0,de\text{-}aliased}$ with a time varying amplification since the more delay, the more attenuation. The amplification at time instance t depends on the maximum value of the impulse response of a generic line of length L=$V_{prop}$×t, with $V_{prop}$ being the propagation speed of the line.

The time varying amplification is topped from a certain time onwards to avoid excessive amplification of the tail.

The skilled person is entitled to consider any other amplification method but the foregoing time varying amplification, including the non amplification of the de-aliased impulse response, as a valid alternative.

Next, two threshold levels allow the detection of the far-end reflections in $s_{11}(t)|_{Z_0,equal\;level}$. The first threshold allows finding the first extremum, which should correspond to the first direct far-end reflection. Starting from that valid extremum, the curve of $s_{11}(t)|_{Z_0,equal\;level}$ is followed in the negative time direction. When a crossing occurs with the second baseline threshold, the start of that first direct far-end reflection is assumed to be found. The neutral zone goes from the time origin up to that time (see FIG. 7).

The skilled person is entitled to consider any other alternative but the foregoing algorithm as a valid alternative. An algorithm based on the computation of a square mean value over a sliding window moving onwards could be such an alternative.

Ultimately, the so-identified time zone is neutralized in the process of estimating the transfer function of the local loop LP.

Referring to the above mentioned prior art, one could for instance set to zero the time samples within said time zone, so as the near-end reflections does no longer preclude the parametric model from converging.

Care must be taken to process the estimated 1-port scattering parameter in the same way than the measured one was, so as the convergence is not biased.

In an alternative embodiment of the present invention, the processing unit PROC would accommodate a feature extraction algorithm operating in the time domain. The algorithm could use the so-identified time zone to distinguish between reflections caused by impedance irregularities and reflections coming from line ends, gauge changes and junctions, the latter ones only being significant.

In an alternative embodiment of the present invention, the processing unit PROC would use a measured curve from a database of $Z_0$ curves as the base impedance. In order to select the proper curve, the technician is requested to enter via the input means IN information about the cable type. Yet, the behavior of the characteristic impedance depends also on external influences such as temperature and aging. And last but not least, the properties of a twisted pair vary from pair to pair in the same cable due to the different twisted rates used. Deviations of 50 Ω at 10 kHz and 5 Ω above 100 kHz were measured.

In an alternative embodiment of the present invention, the capturing window would be increased—up to the extent of the available memory—so as to include the whole impulse response. The foregoing step of removing the time alias would be no longer necessary. Yet, the resulting frequency resolution may contains samples within some prohibited frequency band, making the qualification of some transmission lines impossible.

In an alternative embodiment of the present invention, part or whole of the processing would be performed on a remote host. For instance, the time domain reflectometry unit would be mounted on a card and plugged into a card slot of an access multiplexer, and would send measurement results over a data communication network to a remote processing unit, e.g. to a Personal Computer (PC) over a Local Area Network (LAN) or to a network management station over a telecommunication network.

A final remark is that embodiments of the present invention are described above in terms of functional blocks. From the functional description of these blocks, given above, it will be apparent for a person skilled in the art of designing electronic devices how embodiments of these blocks can be manufactured with well-known electronic components. A detailed architecture of the contents of the functional blocks hence is not given.

While the principles of the invention have been described above in connection with specific apparatus, it is to be clearly understood that this description is made only by way of example and not as a limitation on the scope of the invention, as defined in the appended claims.

What is claimed is:

1. A method for estimating attributes of a transmission line (LP), said method comprising the steps of:
   carrying out reflectometry measurements of said transmission line,
   determining from said reflectometry measurements a 1-port scattering parameter of said transmission line in a reference impedance base (Zref), characterized in that said method further comprises the steps of:
   estimating a characteristic impedance (Z0) of said transmission line,
   converting said 1-port scattering parameter from said reference impedance base to an estimated characteristic impedance base, thereby yielding a second 1-port scattering parameter with residual near-end reflections,
   determining a time zone wherein said residual near-end reflections are enclosed,
   neutralizing said time zone in the process of estimating said attributes.

2. A method according to claim 1, characterized in that said characteristic impedance is estimated by carrying out the steps of:
   deriving from said (first) 1-port scattering parameter an input impedance (Zin) of said transmission line,
   defining a parametric model of said characteristic impedance, estimating coefficients of said parametric model with respect to said input impedance.

3. An apparatus (TEST) adapted to estimate attributes of a transmission line (LP) and comprising:

a reflectometry unit (TDR) coupled to said transmission line and adapted to carry out reflectometry measurements of said transmission line, a processing unit (PROC) coupled to said reflectometry unit and adapted to determine from said reflectometry measurements a 1-port scattering parameter of said transmission line in a reference impedance base (Zref), characterized in that said processing unit is further adapted to:

estimate a characteristic impedance (Z0) of said transmission line, convert said 1-port scattering parameter from said reference impedance base to an estimated characteristic impedance base, to thereby yield a second 1-port scattering parameter with residual near-end reflections, determine a time zone wherein said residual near-end reflections are enclosed, neutralize said time zone in the process of estimating said attributes.

4. An apparatus according to claim 3, characterized in that said processing unit is remotely coupled to said reflectometry unit via a telecommunication network.

* * * * *